United States Patent [19]

(12) United States Patent (10) Patent No.: US 8,571,092 B2
Kim et al. (45) Date of Patent: Oct. 29, 2013

(54) INTERCONNECT CODING METHOD AND APPARATUS

(75) Inventors: Eric P. Kim, Champaign, IL (US); Hun-Seok Kim, Addison, TX (US); Manish Goel, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 196 days.

(21) Appl. No.: 13/273,842

(22) Filed: Oct. 14, 2011

(65) Prior Publication Data

US 2013/0094542 A1 Apr. 18, 2013

(51) Int. Cl.
*H04B 1/38* (2006.01)

(52) U.S. Cl.
USPC .......................................................... 375/219

(58) Field of Classification Search
USPC .......................................................... 375/219
See application file for complete search history.

(56) References Cited

U.S. PATENT DOCUMENTS

| | | | |
|---|---|---|---|
| 6,834,335 | B2 | 12/2004 | Fallah et al. |
| 7,356,646 | B2 * | 4/2008 | Kim .............................. 711/115 |
| 7,640,444 | B2 | 12/2009 | Graef |
| 8,024,642 | B2 * | 9/2011 | Lastras-Montano .......... 714/763 |
| 2007/0174643 | A1 * | 7/2007 | Graef ............................ 713/300 |
| 2008/0043855 | A1 * | 2/2008 | Krishnan et al. .............. 375/257 |
| 2009/0112551 | A1 * | 4/2009 | Hollis ............................. 703/14 |
| 2012/0072799 | A1 * | 3/2012 | Ishioka ......................... 714/746 |
| 2013/0028326 | A1 * | 1/2013 | Moriya et al. ........... 375/240.16 |

OTHER PUBLICATIONS

"Interconnect Limits on Gigascale Integration (GSI) in the 21st Century," Proceedings of the IEEE, vol. 89, No. 3, Mar. 2001, pp. 305-324 (Davis, et al.).
"The Challenge of Signal Integrity in Deep-Submicrometer CMOS Technology," Proceedings of the IEEE, vol. 89, No. 4, Apr. 2001, pp. 556-573 (Caignet, et al.).
"Modeling and Analysis of Crosstalk Noise in Coupled RLC Interconnects," IEEE Transactions on Computer-Aided Design of Integrated Circuits and Systems, vol. 25, No. 5, May 2006, pp. 892-901 (Agarwal, et al.).
"Delay and Noise Estimation of CMOS Logic Gates Driving Coupled Resistive-Capacitive Interconnections,"Integration, the VLSI journal 29 (2000), pp. 131-165 (Tang, et al.).
"Bus Energy Minimization by Transition Pattern Coding (TPC) in Deep Sub-Micron Technologies," Proceedings of the 2000 IEEE/ACM International Conference on Computer-Aided Design, IEEE Press, 2000, pp. 322-327 (Sotiriadis, et al.).
"Bus-Invert Coding for Low-Power I/O," IEEE Transactions on Very Large Scale Integration (VLSI) Systems, vol. 3, No. 1, Mar. 1995, pp. 49-58 (Stan, et al.).

* cited by examiner

*Primary Examiner* — Jaison Joseph
(74) *Attorney, Agent, or Firm* — John R. Pessetto; W. James Brady; Frederick J. Telecky, Jr.

(57) ABSTRACT

A computer program that is embodied on a storage medium for execution on a processor is provided. With this computer program, A current cost is calculated for each transition on a bus having a predetermined width for a functional circuit so as to form a transition cost matrix. Then, a predetermined number of the lowest cost transitions for from the transition cost matrix is determined so as to generate a probability transition matrix. The product of the probability transition matrix and the transition cost matrix can be iteratively determined, while also updating the probability transition matrix until the probability transition matrix converges.

5 Claims, 6 Drawing Sheets

INTERCONNECT CODING METHOD AND APPARATUS

TECHNICAL FIELD

The invention relates generally to encoding and, more particularly, to encoding data to reduce the cost for transitions on a bus.

BACKGROUND

Figure 1:
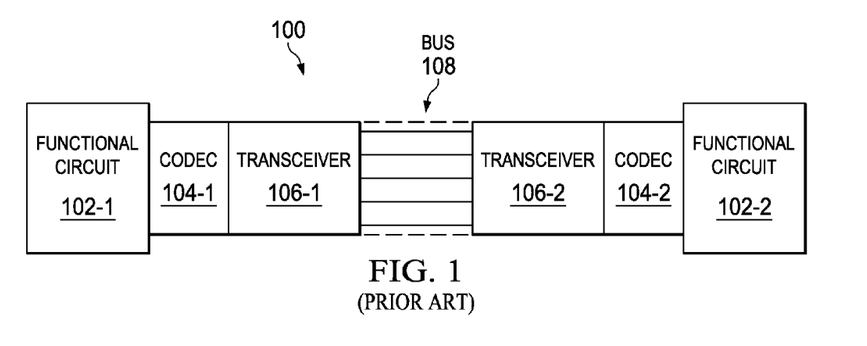
FIG. 1 is a diagram of an example of a conventional communication system.

Turning to FIG. 1, an example of a conventional communication system 100 can be seen. As shown, this system generally comprises functional circuits 102-1 and 102-2 that communicate with one another over a communication channel (which generally includes codes 104-1 and 104-2, transceivers 106-1 and 106-2, and bus 108). When transmitting data across a bus 108, transitions between cycles can be costly in terms of power consumption, so the codecs 104-1 and 104-2 are employed to reduce current consumption associated with these transitions. For example, if it assumed that the bus 108 is 4 bits wide, an transition from "0000" to "1111" is much more costly than a transition from "0000" to "0001." Thus, to avoid the costly transitions, codecs 104-1 and 104-2 employ what is known as "invert codes," which introduces an extra bit to the bus 108 to indicate an inverse. For example, as shown in FIG. 1, bus 108 is 4 bits wide with an extra invert bit (effectively making the bus 108 5 bits wide). In this example, when there is a transition from "0000" to "1111," the invert bit is toggled to "1" so that the bus transmits "10000." By using the invert bit, it allows the number of transitions to be limited to 3 (instead of 4) with a 4-bit bus.

While this "invert code" system (i.e., system 100) can reduce the peak current by up to 50% and reduce energy consumption by up to 30%, there are some drawbacks. Namely, these systems are also less than optimal in savings related to peak current and energy consumption. Thus, there is a need for an improved system.

Some examples of conventional systems are: Davis et al., "Interconnect limits on gigascale integration (gsi) in the 21st century," *Proceedings of the IEEE*, vol. 89, no. 3, pp. 305-324, 2001; Caignet et al., "The challenge of signal integrity in deep-submicrometer CMOS technology," *Proceedings of the IEEE*, vol. 89, no. 4, pp. 556-573, 2001; Agarwal et al., "Modeling and analysis of crosstalk noise in coupled rlc interconnects," *IEEE Trans. Comput.-Aided Design Integr. Circuits Syst.*, vol. 25, no. 5, pp. 892-901, 2006; Tang et al., "Delay and noise estimation of CMOS logic gates driving coupled resistive-capacitive interconnections," *INTEGRATION, the VLSI journal*, vol. 29, no. 2, pp. 131-165, 2000; Sotiriadis et al., "Bus energy minimization by transition pattern coding (TPC) in deep sub-micron technologies," *Proceedings of the 2000 IEEE/ACM international conference on Computer-aided design. IEEE Press*, 2000, pp. 322-328; Stan et al., "Bus-invert coding for low-power I/O," *Very Large Scale Integration (VLSI) Systems, IEEE Transactions on*, vol. 3, no. 1, pp. 49-58, 1995; U.S. Pat. No. 6,834,335; and U.S. Pat. No. 7,640,444.

SUMMARY

An embodiment of the present invention, accordingly, provides an apparatus. The apparatus comprises a functional circuit; and a codec that is coupled to the functional circuit, wherein the codec includes: a buffer that is configured to receive transmission data from the functional circuit and to provide reception data to the functional circuit; a lookup table (LUT) having a probability transition matrix for encoding and decoding, wherein the probability transition matrix is a transition pattern encoded matrix based on a transition cost matrix corresponding to an average current cost for the functional circuit that is substantially minimized over a plurality of transitions; and a controller that is coupled to the buffer, that is to configured to encode the transmission data using the LUT to generate encoded transmission data, and that is configured to decode encoded reception data using the LUT.

In accordance with an embodiment of the present invention, the buffer further comprises a first buffer, and wherein the codec further comprises a second buffer that is coupled to the controller, that is configured to receive the encoded reception data, and that is configured to transmit encoded transmission data.

In accordance with an embodiment of the present invention, the apparatus further comprises transceiver that is coupled to the second buffer.

In accordance with an embodiment of the present invention, the apparatus further comprises a bus that is coupled to the transceiver.

In accordance with an embodiment of the present invention, the probability transition matrix, when calculated, is iteratively updated in response to the product of the probability transition matrix and the transition cost matrix until the probability transition matrix converges.

In accordance with an embodiment of the present invention, a computer program that is embodied on a storage medium for execution on a processor is provided. The computer program comprises the steps of: calculating a current cost for each transition on a bus having a predetermined width for a functional circuit so as to form a transition cost matrix; determining a predetermined number of the lowest cost transitions for from the transition cost matrix so as to generate a probability transition matrix; iteratively determining the product of the probability transition matrix and the transition cost matrix and updating the probability transition matrix until the probability transition matrix converges.

In accordance with an embodiment of the present invention, the predetermined number is $2^m$, wherein m is an information width.

In accordance with an embodiment of the present invention, the step of determining the predetermined number of the lowest cost transitions further comprises forming the probability transition matrix is formed by assigning input probabilities in as ascending order of cost to descending order of probability.

In accordance with an embodiment of the present invention, the step of iteratively determining the product further comprises determining the Hadamard product of the probability transition matrix and the transition cost matrix for each iteration.

In accordance with an embodiment of the present invention, the step of calculating the current cost for each transition further comprises calculating an average so as to determine an average current.

In accordance with an embodiment of the present invention, the step of calculating the current cost for each transition further comprises calculating a maximum so as to determine a peak current.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Refer now to the drawings wherein depicted elements are, for the sake of clarity, not necessarily shown to scale and wherein like or similar elements are designated by the same reference numeral through the several views.

Figure 2:
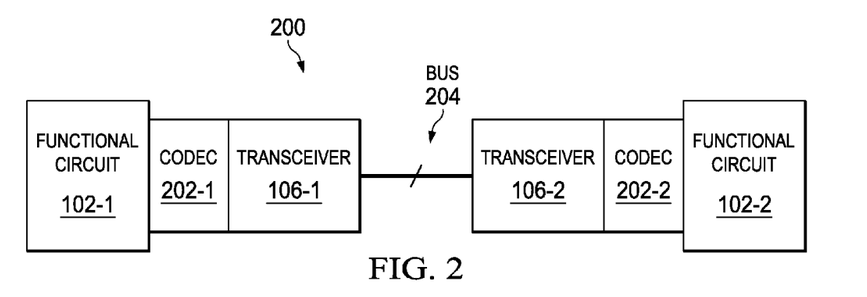
FIG. 2 is a diagram of an example of a communication system in accordance with an embodiment of the present invention.

Turning to FIG. 2, an example of a communication system 200 in accordance with an embodiment of the present invention can be seen. The communication system 200 is similar to system except that codec 104-1 and 104-2 and bus 108 have been replaced with codecs 202-1 and 202-2 and bus 204. Instead of using an invert code (as codecs 104-1 and 104-2 employ), codecs 202-1 and 202-2 use probability transition matrices that are transition pattern encoded matrixes based on a transition cost matrix corresponding to a cost function (i.e., an average current cost) for the respective functional circuit 102-1 or 102-2 that is substantially minimized over a several transitions. In other words, codecs 202-1 and 202-2 uses encoding and decoding tables or matrices that reduce peak currents and energy consumption over large numbers of cycles (where transitions occur between cycles).

Figure 3:
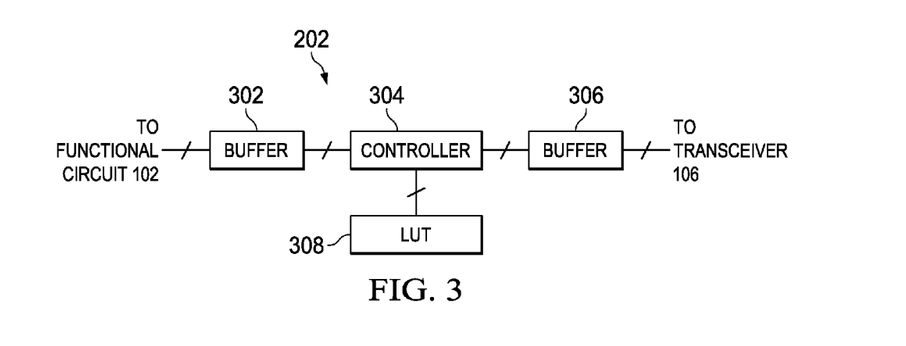
FIG. 3 is a diagram of an example of a codec of FIG. 2.
Figure 4:
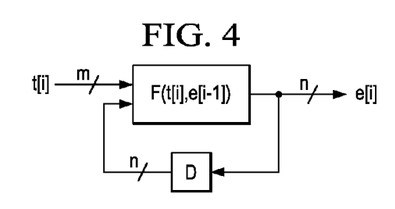
FIGS. 4 and 5 are diagrams modeling the encoder and decoder features, respectively, of the codec of FIG. 3.
Figure 5:
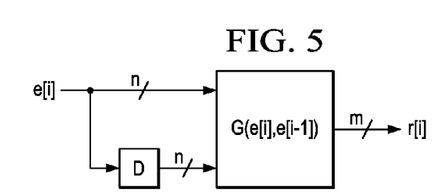
Figure 6:
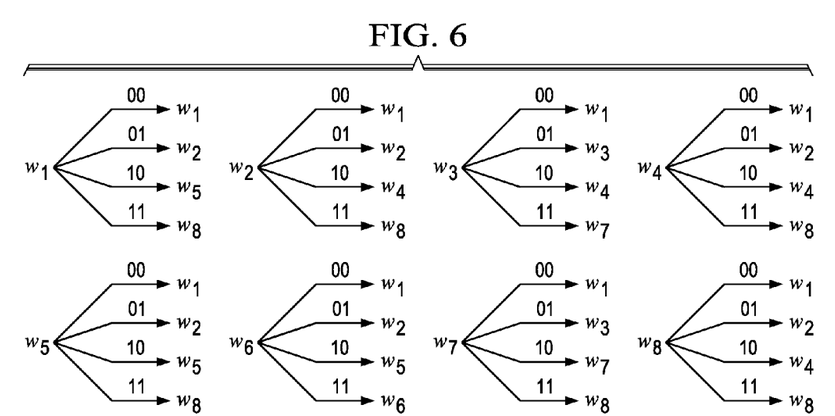
FIG. 6 is an example of a transition pattern code (TPC) transition diagram.

To do this, the codecs 202-1 and 202-2 (which can be seen in greater detail in FIG. 2 and which are referred to hereinafter as 202) employ a logic operations on incoming data (i.e., transmission data from functional circuit 102 or encoded receive data from transceiver 106). Buffers 302 and 306 are used as temporary storage for data that allow data to be encoded or decoded by controller 304, which uses lookup table (LUT) 208. Generally, for encoding, the encoded transmission data e[i] (which is represented by the model shown in FIG. 4) can be:

$$e[i]=F(t[i],e[i-1]) \quad (1)$$

where F is the encode function and t[i] is the transmission data. As shown, this encoding function uses the data t[i] (which has an information width of m) and the previous or delayed encoded transmission data e[i−1] (which has as a width n that is equal to that of bus 204 and is greater than the information width m). For decoding, the reception data r[i] (which can be represented by the model shown in FIG. 5) can be:

$$r[i]=G(e[i],e[i-1]) \quad (2)$$

where G is the decode function and is generally the inverse of encode function F.

Looking to the encode function F, in particular, it can be represented by a transition pattern matrix (or, simply, transition matrix) $\overline{T}$, which can be written as:

$$\overline{T} = [t_{i,j}]_{i,j=1}^{2^n} \quad (3)$$

where $$t_{i,j} = \begin{cases} 1 \\ 0 \end{cases} \quad (4)$$

with the valid transitions being represented as "1" and invalid as "0." Each row of this transition matrix $\overline{T}$ has $2^m$ non-zero elements, and, if the input has a distribution, the transition matrix $\overline{T}$ can be represented as a probability transition matrix $\overline{P}$, where each entry corresponds to a probability value within the distribution and where all rows will sum to 1. For a uniform distribution, probability transition matrix $\overline{P}$ is:

$$\overline{P} = \frac{1}{2^m}\overline{T} \quad (5)$$

As an example, if a (2,1) TPC code (where the information width m is 2 and the bus width n is 3) is employed, there are eight code words $w_1$ to $w_8$ (as shown in the transition diagram of FIG. 3) that result in the following probability transition matrix $\overline{P}$:

$$\overline{P} = \frac{1}{4}\begin{bmatrix} 1 & 1 & 0 & 0 & 1 & 0 & 0 & 1 \\ 1 & 1 & 0 & 1 & 0 & 0 & 0 & 1 \\ 1 & 0 & 1 & 1 & 0 & 0 & 1 & 0 \\ 1 & 1 & 0 & 1 & 0 & 0 & 0 & 1 \\ 1 & 1 & 0 & 0 & 1 & 0 & 0 & 1 \\ 1 & 1 & 0 & 0 & 1 & 1 & 0 & 0 \\ 1 & 0 & 1 & 0 & 0 & 0 & 1 & 1 \\ 1 & 1 & 0 & 1 & 0 & 0 & 0 & 1 \end{bmatrix} \quad (6)$$

In order to take advantage of the probability transition matrix $\overline{P}$, there are several features to compensate for with the bus 204, namely, peak current and energy consumption. This problem can be though of as an optimization process for probability transition matrix $\overline{P}$, where the theoretically optimized matrix $\overline{P}$ OPT is:

$$\overline{P}_{OPT} = \underset{P \in \{TPC\}}{\mathrm{argmin}}(\alpha I_{peak,bus} + (1-\alpha)I_{avg,bus}). \quad (7)$$

Turning first to energy consumption (or average current) optimization, α is set equal to 0 so that equation (7) becomes:

$$\overline{P}_{OPT} = \underset{P \in \{TPC\}}{\mathrm{argmin}} I_{avg,bus}. \quad (8)$$

Assuming a stationary ergodic input process, the TPC can be assumed to be a first order homogenous Markov process, which allows the average current $I_{avg,bus}$ to be:

$$I_{avg,bus} = \lim_{N \to \infty} \frac{1}{N} \sum_{i=1}^{N} \overline{C_{Iavg}(e[i-1], e[i])}, \quad (9)$$

where $C_{Iavg}(e[i-1],e[i])$ is that average current cost of a transition from $e[i-1]$ to $e[i]$. With an initial probability of $p(0)$, $\overline{C_{Iavg}(e[i-1],e[i])}$ can be expressed as:

$$\overline{C_{Iavg}(e[i-1], e[i])} = p(0)P^{i-1}(\overline{P \cdot \overline{C_{Iavg}}})\underline{1}, \quad (10)$$

where $\underline{1}$ is an all-1 column vector, $\overline{C_{Iavg}}$ is average current cost matrix, and • denotes the Hadamard product. Convergence of the average current $I_{avg,bus}$ in equation (9) implies that equation (10) converges, and, it can be observed that:

$$\lim_{N \to \infty} P^i = \overline{X} = \overline{XP} = \overline{PX} \quad (11)$$

Thus, $\overline{X}$ consists of the left and right eigenvectors of probability transition matrix $\overline{P}$ which correspond to an eigenvalue of 1. Since the row sum for probability transition matrix $\overline{P}$ is 1, then the right eigenvector that corresponds to eigenvalue 1 is column vector $\underline{1}$. This means that $\overline{X}$ is the outer product of the left and right eigenvectors, yielding:

$$\lim_{N \to \infty} P^i = \overline{X} = \underline{1}\underline{b}^T \quad (12)$$

where $\underline{b}$ is the left eigenvector. Now, combining equations (9), (10), and (12), the average current $I_{avg,bus}$ becomes:

$$I_{avg,bus} = \lim_{N \to \infty} \frac{1}{N} \sum_{i=1}^{N} \overline{C_{Iavg}(e[i-1], e[i])} \quad (13)$$

$$= \lim_{N \to \infty} \frac{1}{N} \sum_{i=1}^{N} p(0)P^{i-1}(\overline{P \cdot \overline{C_{Iavg}}})\underline{1}$$

$$= p(0)\left[\sum_{i=1}^{N} P^{i-1}(\overline{P \cdot \overline{C_{Iavg}}})\right]$$

$$\approx p(0)\left[(\overline{P[0] \cdot \overline{C_{Iavg}}}) + \sum_{i=2}^{N}\left[\left(\prod_{j=0}^{i-2} P[j]\right)(\overline{P[i-1] \cdot \overline{C_{Iavg}}})\right]\right]$$

Figure 7:
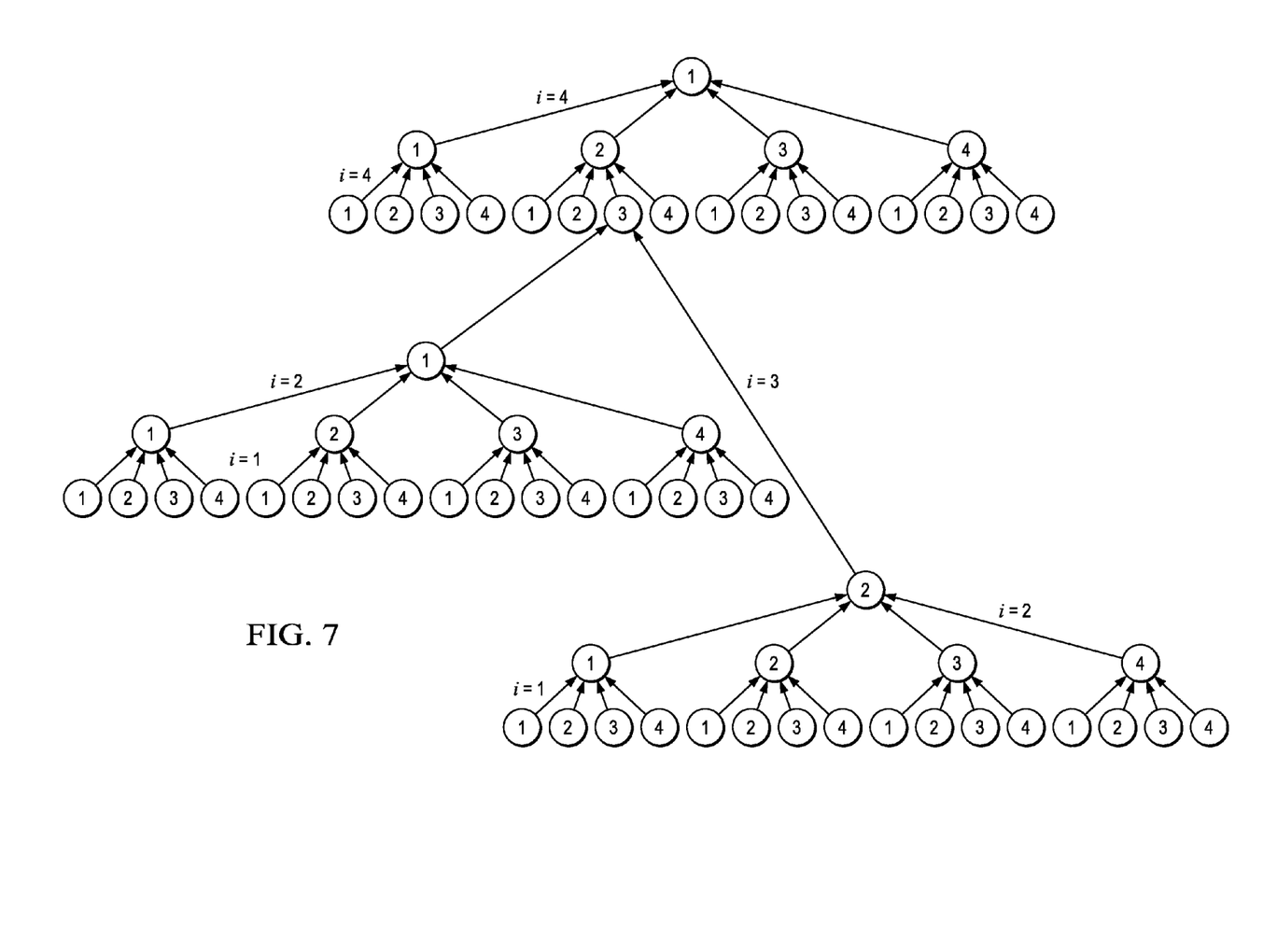
FIG. 7 is an example of a five level tree diagram corresponding to the TPC transition diagram of FIG. 6.

A five level (transition) tree diagram for the computation of the average current $I_{avg,bus}$ of equation (10) can be seen in FIG. 7.

Figure 8:
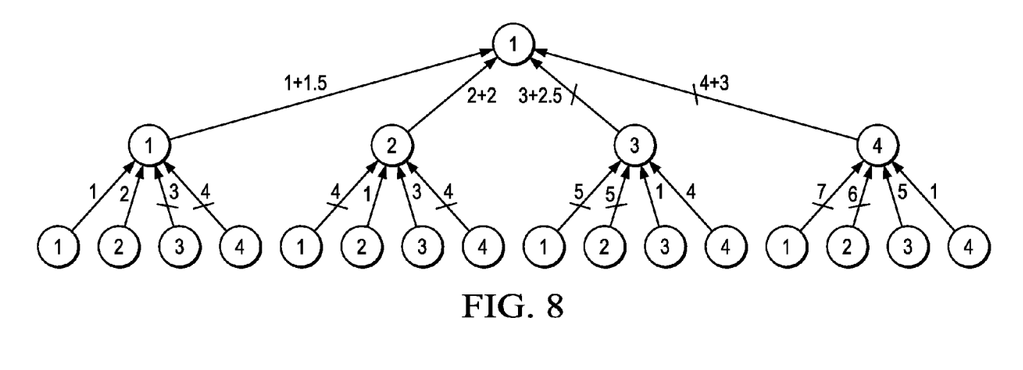
FIG. 8 is a diagram depicting an example of tree optimization.
Figure 9:
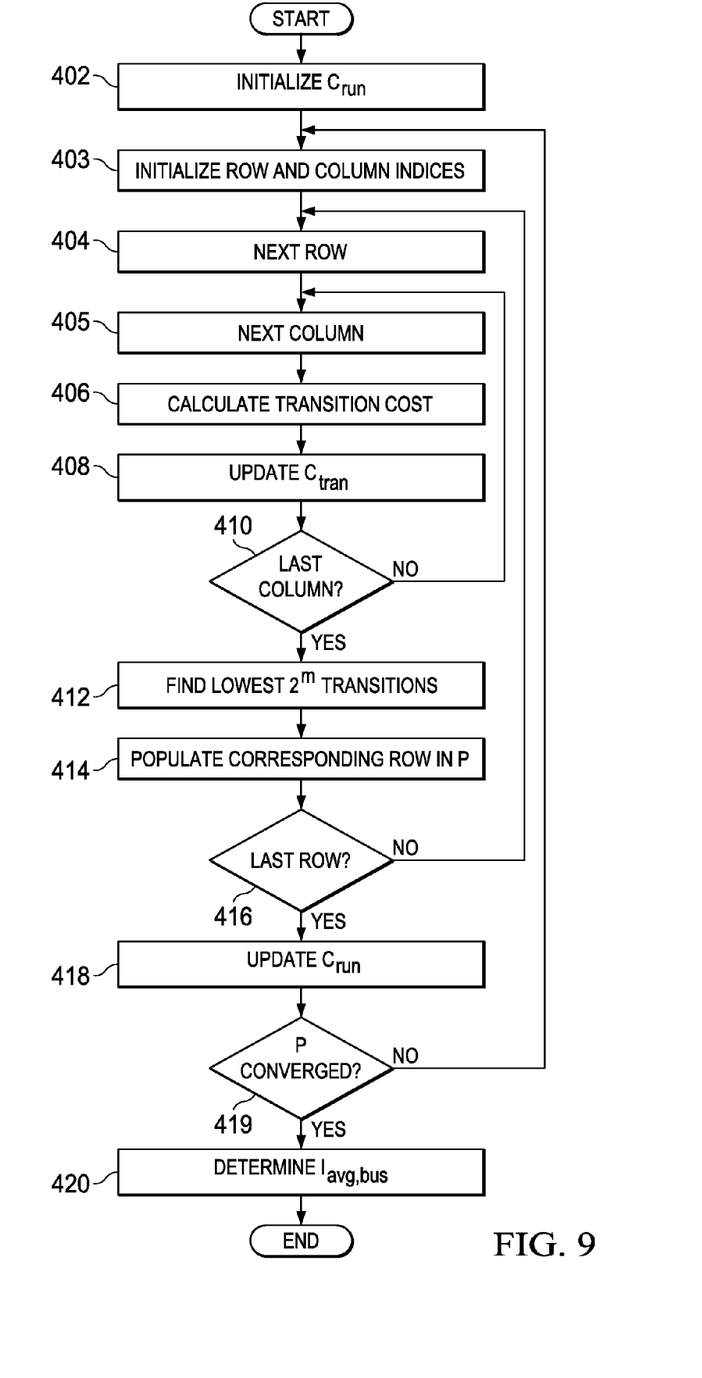
FIG. 9 is a flow chart for an example method for determining an average bus current.

To be able to optimize the tree (shown in FIG. 7) should be "pruned." This "pruning" is performed iteratively using a transition cost matrix $\overline{C_{tran}}$ until the probability transition matrix $\overline{P}$ converges. A diagrammatic example of "pruning" can be seen in FIG. 8, and a flow chart depicting a method for performing this "pruning" can be seen in FIG. 9. Initially, the running cost vector $\overline{C_{run}}$ (which is a column vector whose k-th component indicates the accumulated cost of the k-th state) is initialized with a column vector $\underline{0}$ in step 402, and the row and column indices are initialized in step 403. Once initialized, the transition cost matrix $\overline{C_{tran}}$ is calculated by calculating the transitions costs in step 406 or each column (as set forth in steps 405 and 410) and within each row (as set forth in steps 404 and 416) and updating the transition cost matrix $\overline{C_{tran}}$ in step 408. Preferably, the transition cost matrix $\overline{C_{tran}}$ is updated in step 408 by averaging the calculated cost with a cost from the column of the running cost vector $\overline{C_{run}}$. While the transition cost matrix $\overline{C_{tran}}$ is calculated, the lowest predetermined number (which is generally related to the information width m and which is generally $2^m$) of lowest cost transitions in transition cost matrix $\overline{C_{tran}}$ are identified in step 412. This is usual performed at after calculations for each row of transition cost matrix $\overline{C_{tran}}$ so as to allow the corresponding row in probability transition matrix $\overline{P}$ to be populated in step 414. Once completed for each row, the running cost vector $\overline{C_{run}}$ is updated in step 418, and, in step 419, a determination is made (based on a previous iteration) as to whether the probability transition matrix $\overline{P}$ has converged. If not, the process begins again in step 403, and, if probability transition matrix $\overline{P}$ has converged, the average current $I_{avg,bus}$ is determined in step 420. Typically, the average current $I_{avg,bus}$ is determined by use of equation (11) with the probability transition matrix $\overline{P}$ and the transition cost matrix $\overline{C_{tran}}$.

With the average current $I_{avg,bus}$ having been generally resolved, the focus can be turned to determining peak current optimization. For peak current, $\alpha$ is set equal to 1 so that equation (7) becomes:

$$\overline{P}_{OPT} = \underset{P \in \{TPC\}}{\operatorname{argmin}} I_{peak,bus}.$$

Figure 10:
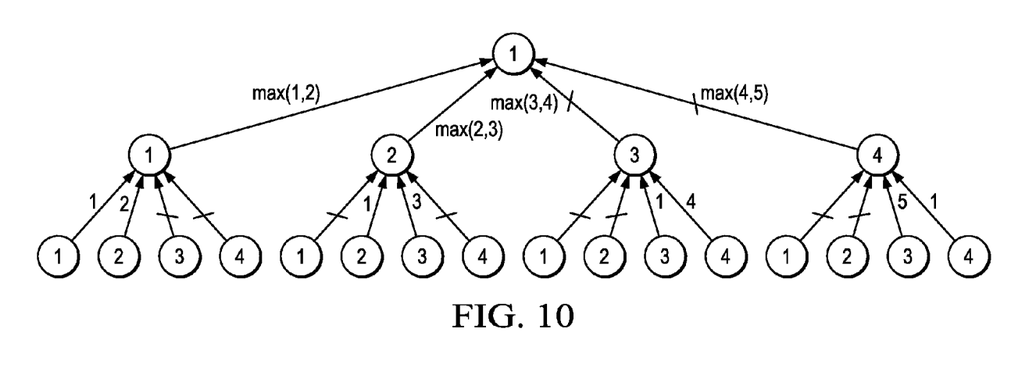
FIG. 10 is a diagram depicting an example of tree optimization for peak current.

For computation of the peak current $I_{peak,bus}$, the algorithm is similar to that used for the average current $I_{avg,bus}$ (which is described above), except that computation of the cost (i.e., step 406) is slightly difference. As shown in the example tree diagram of FIG. 10, peak current is generally a maximum, which is usually equivalent to the maximization operation. As no averaging is employed (i.e., step 408), the cost propagation is also generally a maximum, rather than the average of the surviving branches.

Due to the similarities in the algorithms, calculation for the average current $I_{avg,bus}$ and the peak current $I_{peak,bus}$ can be performed at the same time. To perform joint optimization among the average current $I_{avg,bus}$ and the peak current $I_{peak,bus}$ (for any value of $\alpha$), the tree optimization algorithm can be further modified to propagate a cost vector $v=(C_{avg}; C_{peak})$. Each element of the cost vector v is computed using the same methods described above. However, the cost that is calculated to perform branch pruning is defined by the cost function f as follows:

$$f(C_{avg}, C_{peak}) = \alpha C_{peak} + (1-\alpha)C_{avg}. \quad (15)$$

The cost function f need not be limited to the weight sum expression in equation (15), and can be any generic function. Preferably, (as described above in step 412), the pruning would be also performed by identifying the $2^m$ lowest transitions. Further generalization of joint optimization is also possible by increasing the dimensions of v and implementing a suitable cost function f. For example, delay could be incorporated by using cost vector v and cost function f. Additionally, these calculations (due to complexity) cannot be calculated "by hand" but instead are computed by a processor or computer using software (which is embodied on a storage medium). This processor and memory can either be separate from or included within controller 304.

Figure 11:
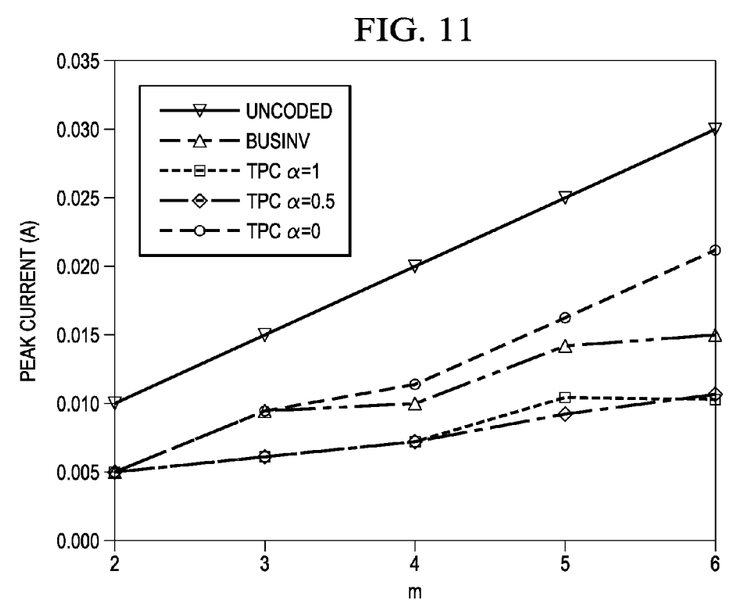
FIGS. 11 and 12 are diagrams depicting the operation of the system of FIG. 2.
Figure 12:
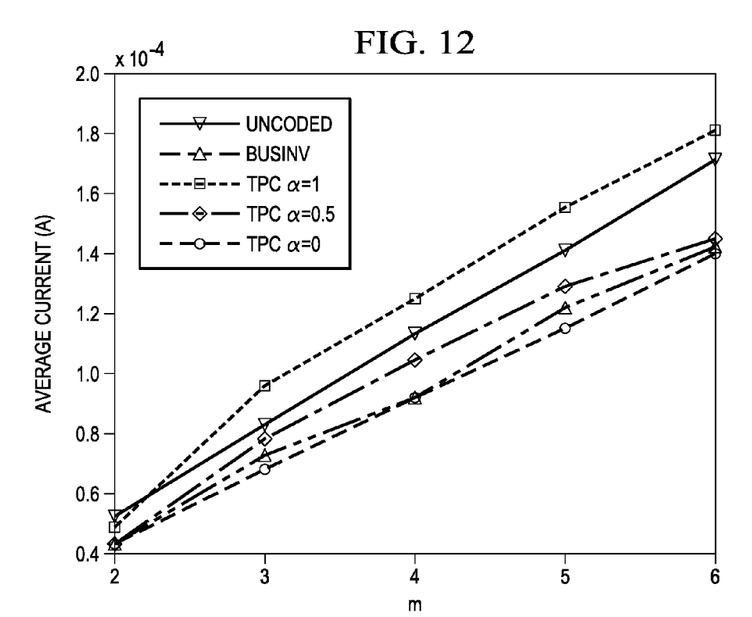

The performance of this methodology compared to an uncoded bus and bus invert coded bus is given in FIGS. 11 and 12. It can be seen that a is a suitable variable for balancing the optimization between the average current $I_{avg,bus}$ and the peak current $I_{peak,bus}$. This coding scheme provides up to 70% reduction in peak current and 15% savings in energy compared to an uncoded bus, and 30% reduction in peak current and 7% savings in energy compared to a bus invert coded bus. Also, the shift of balance between peak current optimization or energy optimization can be seen depending on the value of $\alpha$, where $\alpha=1$ is peak current only optimization and $\alpha=0$ is energy only optimization.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a functional circuit; and
   a codec that is coupled to the functional circuit, wherein the codec includes:
   a buffer that is configured to receive transmission data from the functional circuit and to provide reception data to the functional circuit;
   a lookup table (LUT) having a probability transition matrix for encoding and decoding, wherein the probability transition matrix is a transition pattern encoded matrix based on a transition cost matrix corresponding to an average current cost for the functional circuit that is substantially minimized over a plurality of transitions; and
   a controller that is coupled to the buffer, that is configured to encode the transmission data using the LUT to generate encoded transmission data, and that is configured to decode encoded reception data using the LUT.

2. The apparatus of claim 1, wherein the buffer further comprises a first buffer, and wherein the codec further comprises a second buffer that is coupled to the controller, that is configured to receive the encoded reception data, and that is configured to transmit encoded transmission data.

3. The apparatus of claim 2, wherein the apparatus further comprises transceiver that is coupled to the second buffer.

4. The apparatus of claim 3, wherein the apparatus further comprises a bus that is coupled to the transceiver.

5. The apparatus of claim 4, wherein the probability transition matrix, when calculated, is iteratively updated in response to the product of the probability transition matrix and the transition cost matrix until the probability transition matrix converges.

* * * * *